United States Patent [19]

Hayakawa et al.

[11] 4,359,754
[45] Nov. 16, 1982

[54] SEMICONDUCTOR DEVICE

[75] Inventors: Masahiro Hayakawa, Kawasaki; Yutaka Hirano, Atsugi, both of Japan

[73] Assignee: Fujitsu Limited, Hanagawa, Japan

[21] Appl. No.: 135,182

[22] Filed: Mar. 28, 1980

[30] Foreign Application Priority Data

Mar. 30, 1979 [JP] Japan ............................ 54-38227

[51] Int. Cl.³ .................... H01L 25/04; H01L 23/48
[52] U.S. Cl. ............................... 357/22; 357/68; 357/75; 357/36
[58] Field of Search ................ 357/68, 36, 74, 75, 357/80, 51, 22

[56] References Cited

U.S. PATENT DOCUMENTS

| 3,336,508 | 8/1967 | Preletz et al. | 357/36 |
| 3,893,159 | 7/1975 | Martin | 357/75 |
| 4,236,171 | 11/1980 | Shen | 357/36 |

Primary Examiner—William D. Larkins
Attorney, Agent, or Firm—Staas & Halsey

[57] ABSTRACT

A semiconductor device used, for example, for the amplification of microwave signals, comprising a plurality of semiconductor elements mounted on a base and connected parallel to each other in order to gain high output power, wherein the same type of corresponding electrodes of the adjacent semiconductor elements are directly connected to each other so that self oscillation does not occur in the device and the operation thereof is stable.

6 Claims, 3 Drawing Figures

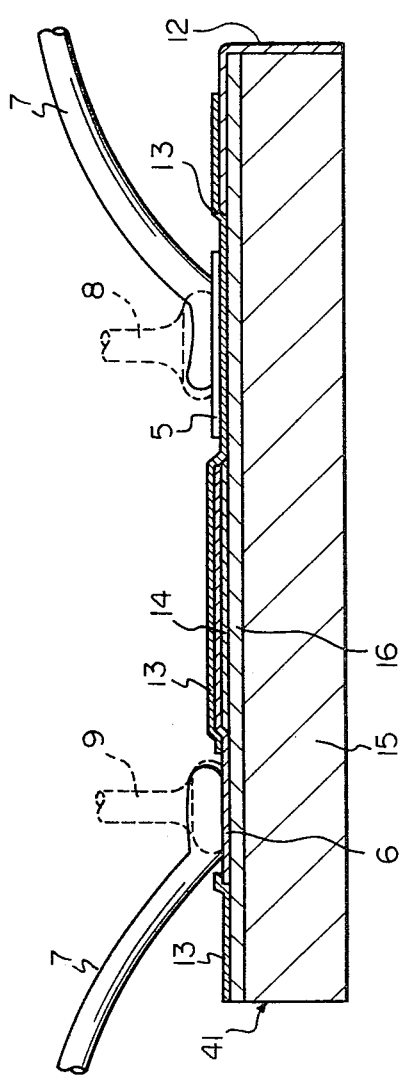

SEMICONDUCTOR DEVICE

BACKGROUND OF THE INVENTION

1. Field of the Invention

The present invention relates to a semiconductor device, more particularly to a semiconductor device having a plurality of semiconductor chips used, for example, for the power amplification of microwave signals.

2. Description of the Prior Art

In general, a high-frequency high-power semiconductor device which comprises a plurality of semiconductor chips mounted on a package and connected parallel to each other, and which operates as one device is known. For example, a GaAs FET (GaAs Schottky barrier Field Effect Transistor) device, which is used for the power amplification of microwave signals, comprises a plurality of GaAs FET chips connected parallel to each other in order to substantially increase the total gate width so that the output power is increased.

With reference to FIG. 1, the above-mentioned microwave high-power GaAs FET device, as an example of a prior art semiconductor device having a plurality of GaAs FET chips, will be explained hereinafter. In FIG. 1, two GaAs FET chips 41 and 42 are mounted on a package base 1 which is made, for example, of copper. The package base 1 is used also as an external source electrode, i.e., grounding electrode. On the package base 1, there are provided a gate electrode section 2 which comprises a ceramic plate 20 and a metalized layer (external gate electrode) 21 formed on the ceramic plate 20 and which comprises an input terminal of the FET device, and a drain electrode section 3 which comprises a ceramic plate 30 and a metalized layer (external drain electrode) 31 formed on the ceramic plate 30 and which comprises an output terminal of the FET device. A gate lead 22 and a drain lead 32, which are used for external connection, are connected respectively to the metalized layer 21 of the gate electrode section 2 and the metalized layer 31 of the drain electrode section 3. Each of the GaAs FET chips or elements 41, 42 is a device having an interdigital structure of the electrodes. In FIG. 1, detailed illustration of the structure of the gate electrode, the drain electrode and the source electrode which are disposed in the interdigital arrangement is omitted. Each of the GaAs FET chips 41, 42 has, for example, four bonding pads 5 of the gate electrode and four bonding pads 6 of the drain electrode. Each of the bonding pads 5 and each of the bonding pads 6 are connected respectively to the metalized layer 21 of the gate electrode section 2 and the metalized layer 31 of the drain electrode section 3 which are both fixed on the package substrate 1, as illustrated in FIG. 1.

In the prior art semiconductor device having the above-mentioned structure, there often occurs a problem in that the device oscillates by itself when the DC power supply voltage is applied thereto. This self oscillation occurs in a frequency range from tens of $MH_z$ to several $GH_z$, and the mechanism of the self oscillation is supposed as follows. Each active element contained in the chips 41, 42 is electrically connected to the external gate electrode 21 and to the external drain electrode 31 disposed on the package base 1 through relatively long bonding wires 7, and the electrical characteristic of each active element is unequal to each other, but a very small unbalance of the electrical characteristic exists because they are manufactured by the same process and in the same manufacturing condition. Moreover, the chips 41 and 42 are mounted close to each other on the package base 1, so that it is difficult to electrically isolate one of the chips from the other. When the DC bias voltage is supplied to the device under the existence of such unbalances, the transfer of electric power occurs between the chip 41 and the chip 42 through the path including the bonding wires 7 and the electrode 21 or the electrode 31 (for example the path a-b-c-d shown in FIG. 1). Such a transfer of electric power makes the operation of the device unstable, and consequently the above-mentioned self oscillation is induced. The dotted lines with arrows in FIG. 1 illustrate such a transfer of electric power. The self oscillation occurs in the above-mentioned frequency range, and the frequency of the self oscillation varies according to the value of the DC power supply voltage.

Examples of a prior art GaAs FET device having the interdigital structure of electrodes are disclosed in "GaAs Microwave Power FET" by M. Fukuta et al, IEEE Transactions on Electron Devices, Vol. ED-23, No. 4, April 1976, pp 388–394, and "Broad-Band Internal Matching of Microwave Power GaAs MESFET's" by K. Honjo et al, IEEE Transactions on Microwave Theory and Techniques, Vol. MTT-27, No. 1, January 1979, pp 3–8.

SUMMARY OF THE INVENTION

It is the principal object of the present invention to stabilize the operation of the aforementioned semiconductor device, which comprises a plurality of semiconductor elements connected parallel to each other in order to gain high output power, so that self-oscillation does not occur.

In order to achieve the above-mentioned object, the present invention uses the idea of directly connecting the same types of electrodes of adjacent semiconductor chips to each other in a semiconductor device comprising a plurality of semiconductor chips. In the semiconductor device according to the present invention, each semiconductor chip can operate in the same electrical condition, even in the high frequency range, so that the above-mentioned transfer of electric power between the semiconductor chips is suppressed and the self oscillation of the semiconductor device can be prevented.

BRIEF DESCRIPTION OF THE DRAWINGS

FIG. 3 is a cross-sectional view of the GaAs FET device illustrated in FIG. 2 taken along line III—III of FIG. 2.

DETAILED DESCRIPTION OF THE PREFERRED EMBODIMENTS

Figure 1:
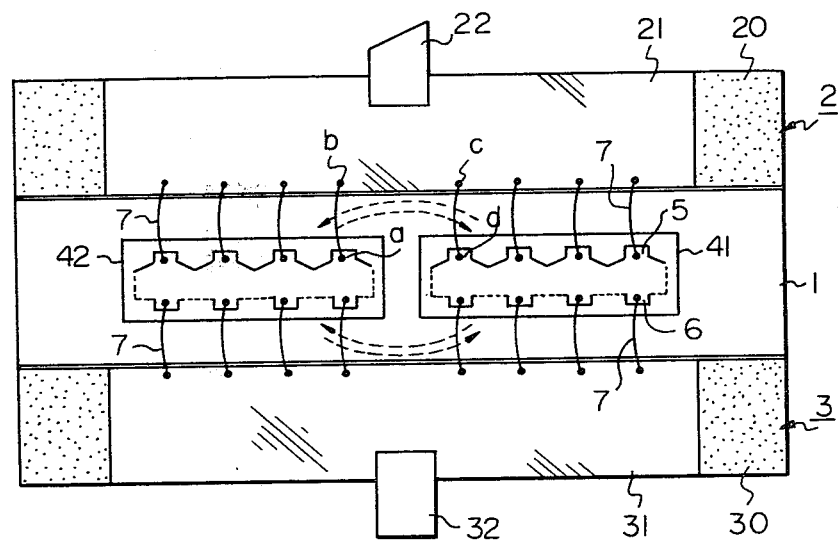
FIG. 1 is a schematic plan view illustrating a conventional GaAs FET device having a plurality of GaAs FET chips.
Figure 2:
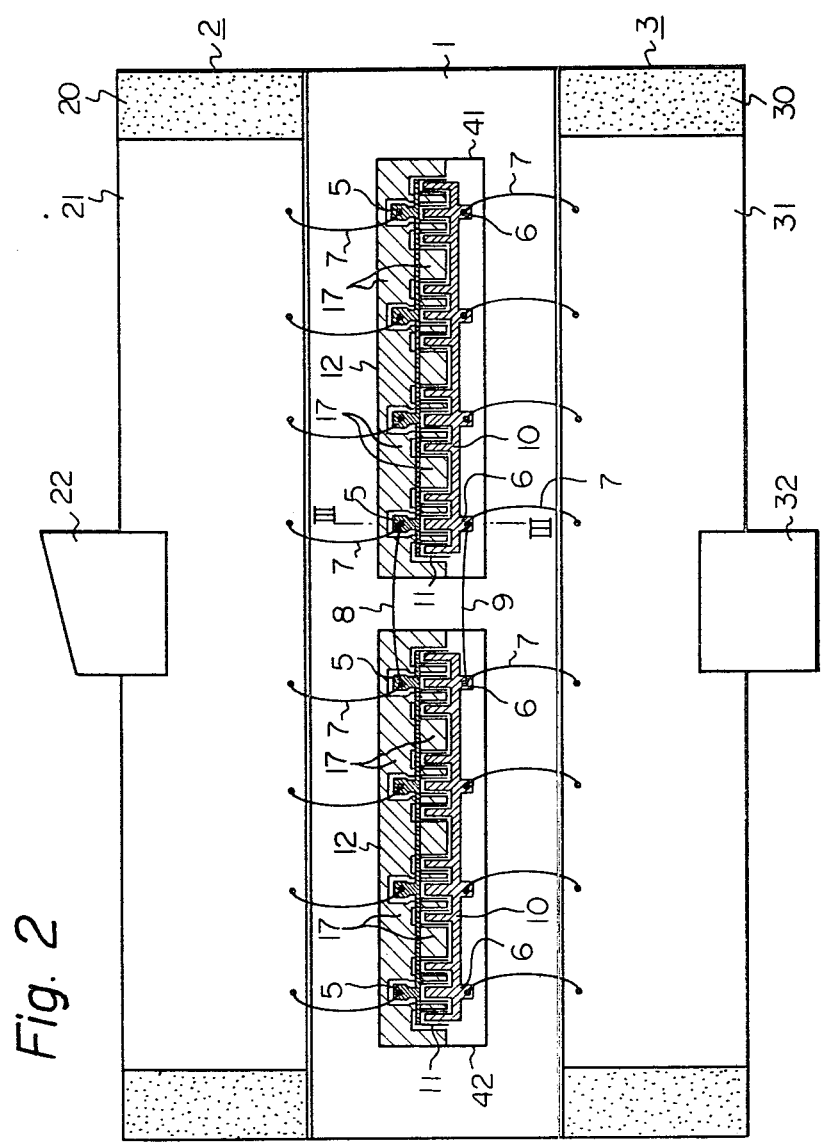
FIG. 2 is an enlarged view illustrating a GaAs FET device having a plurality of GaAs FET chips as an embodiment of the present invention.

With reference to FIG. 2 and FIG. 3, a GaAs Schottky barrier FET device as an embodiment of the present invention will be explained. In FIGS. 2 and 3, parts corresponding to the same parts as in FIG. 1 are designated by the same reference numbers and the explanation thereof is omitted herein. The GaAs FET device illustrated in FIG. 2 comprises two GaAs FET chips or elements 41 and 42 mounted on a package base 1 which is a metal base composed of a copper (Cu) plate having a gold (Au) coating thereon. The GaAs FET chips 41 and 42 are fixed on the metal base by, for example, an Au-Sn solder. The GaAs FET chips 41 and 42 are juxtaposed on the package substrate 1 in a direction which is nearly at right angles to a line connecting the input terminal and the output terminal. The GaAs FET device illustrated in FIG. 2 also comprises an external gate electrode 21 which is the metalized layer formed on a ceramic plate 20, and an external drain electrode 31 which is the metalized layer formed on a ceramic plate 30. In each of the FET chips, for example chip 41, an n type active layer 14 is formed on a semi-insulating GaAs buffer layer 16 which is formed on a semi-insulating GaAs substrate 15, and a source electrode 17, a drain electrode 10 and a gate electrode 11 having an interdigital structure are formed on the n type active layer 14. The source electrode 17 is connected to the package base 1 by said solder at the source side edge 12 of the chip 41. Therefore, the package base 1 constitutes the source electrode of the GaAs FET device, and constitutes a grounding electrode when the GaAs FET device is used in a grounded source circuit. Drain bonding pads 6 communicating with the drain electrode 10 and gate bonding pads 5 communicating with the gate electrode 11 are respectively connected to the external drain electrode 31 and the external gate electrode 21 by bonding wires 7. An insulating layer 13 made of silicon dioxide (SiO2) is used for the protection of the surface of the chip and for insulation between source electrode and gate electrode of the chip.

In the embodiment of the present invention illustrated in FIG. 2, the adjacent gate bonding pads 5, 5 of the chip 41 and the chip 42 are directly coupled by the shortest distance i.e. by a straight line by using a bonding wire 8, and the adjacent drain bonding pads 6, 6 of the chip 41 and the chip 42 are directly coupled by the shortest distance i.e. by a straight line by using a bonding wire 9. By coupling the adjacent bonding pads 5, 5 or the adjacent bonding pads 6, 6 of identical electrodes of the adjacent chips 41, 42 by using the bonding wire 8 or 9, the potential of each of the bonding pads of identical electrodes of the different GaAs FET chips becomes substantially the same, and the operating condition of each of the GaAs FET chips is equalized. Consequently, the transfer of electric power between the GaAs FET chips will not occur, and the operation of the FET device is stabilized so that the self oscillation of the FET device will not occur. This result is confirmed by the following example.

EXAMPLE

In order to confirm that the self oscillation can be prevented by the above-mentioned structure, the GaAs FET device as illustrated in FIG. 2 was produced by using two GaAs FET chips, the gates of which were 7200 μm wide. This GaAs FET device was of the so-called internal matching type, and the matching circuits having the distributed constants were connected to the input and output terminals respectively. This FET device was designed to offer 4 watts power output at a frequency of 8 GHz. At first, the following DC bias voltage were supplied to the device without attaching the bonding wires 8 and 9 illustrated in FIG. 2:

$$V_{DS} = 10 \text{ V}, \quad V_{GS} = -2 \text{ V}$$
$$I_{DS} = (\tfrac{1}{2}) I_{DSS} \approx 1.5 \text{ A}$$

where $V_{DS}$ is the drain-source voltage, $I_{DS}$ is the drain-source current, $I_{DSS}$ is $I_{DS}$ where $V_{GS}=0$, and $V_{GS}$ is the gate-source voltage. However, when the above-mentioned DC bias voltages were supplied, self oscillation occurred. Observation with a spectrum analyser showed the frequency of the self oscillation to distribute from about 10 MHz to about 6 GHz. The frequency and the output level of the self oscillation varied in accordance with the value of the DC bias voltage.

Next, when the adjacent gate bonding pads of the adjacent two chips were connected by the bonding wire 8 as illustrated in FIG. 2, the self oscillation ceased at the above-mentioned DC bias voltages. It will be understood that the effect of the present invention was confirmed by this fact. However, when the DC bias voltages were changed, the self oscillation occurred occasionally at other DC bias voltages. When, in addition to the above-mentioned connection of the gate bonding pads, the adjacent drain bonding pads of the adjacent two chips were connected by the bonding wires 9, the self oscillation did not occur at any DC bias voltages. Therefore, it is most preferable that the gate bonding pads and the drain bonding pads are both directly connected to each other, respectively, in the semiconductor device according to the present invention.

In the above, the GaAs FET device including two semiconductor chips are explained. However, it should be noted that the present invention is not limited to the above-mentioned embodiment, but various modifications are possible. For example, the present invention can be adapted to the GaAs FET device including more than two chips mounted on a package base, or the present invention can be adapted to other kinds of FET devices or to the bipolar transistor device.

The semiconductor device of the above-mentioned embodiment is composed by disposing the frame made for example of ceramic on the electrode sections 2, 3 and the package base 1 surrounding the semiconductor chips and by attaching the cap on the frame so as to hermetically seal the semiconductor chips. Otherwise, the structure illustrated in FIG. 2 can be used by attaching it to another larger base.

In the above-mentioned embodiment, the nearest bonding pads of the chips 41 and 42 are connected to each other as illustrated in FIG. 2. It is also possible to connect more remote bonding pads of the chips 41 and 42 to each other. However, this is not preferable because, in this case, the length of the bonding wires is increased and consequently the inductance of the bonding wires is increased so that the effect of the present invention may not be performed completely, and there is the possibility that the bonding wires will touch other bonding wires or parts of the semiconductor device.

We claim:
1. A semiconductor device comprising
   a base,
   a plurality of chips mounted on said base, each said chip comprising at least one selected plurality of corresponding circuit elements, said corresponding circuit elements being present on each said chip,
   a respective external common electrode mounted on said base corresponding to each said selected plu- rality of corresponding circuit elements on said chips, a respective plurality of connecting wires for individually connecting in parallel each of said selected plurality of corresponding circuit elements to the respective external common electrode, and at least one bonding wire for directly connecting between two selected ones of the corresponding circuit elements on different ones of said chips of at least one of said selected pluralities of corresponding circuit elements, wherein self oscillation in the operation of said device is reduced by the short circuiting provided by each said bonding wire connecting between the corresponding circuit elements on different ones of said chips.

2. The device of claim 1, said chips being aligned in a row on said base, and one of said bonding wires directly connecting between each adjacent pair of the endmost ones of said corresponding circuit elements across adjacent ones of said chips.

3. The device of claim 2, comprising two of said external electrodes, two of said selected pluralities of corresponding elements on said chips connected by two respective ones of said pluralities of connecting wires to two respective ones of said external electrodes, and said bonding wires respectively directly connecting between each said adjacent pair of the endmost ones of said corresponding circuit elements across each adjacent pair of said chips, wherein said device with said parallel connected circuit elements comprises plural identical circuits connected in parallel between said two external electrodes.

4. The device of claim 1, 2 or 3, one of said external electrode(s) providing in parallel a respective DC voltage to the respective selected plurality of corresponding circuit elements on said chips.

5. The device of claim 1, 2 or 3, comprising a parallel connection of field effect transistors, each said field effect transistor comprising a respective semiconductor element of each said selected plurality, wherein said device comprises effectively a FET device with a correspondingly large effective gate width.

6. The device of claim 4, each said field effect transistor comprising a Schottky barrier field effect transistor.

* * * * *

UNITED STATES PATENT AND TRADEMARK OFFICE
CERTIFICATE OF CORRECTION

PATENT NO. : 4,359,754

DATED : 16 November 1982

INVENTOR(S) : MASAHIRO HAYAKAWA et al

It is certified that error appears in the above-identified patent and that said Letters Patent is hereby corrected as shown below:

Title page, [73] Assignee, "Hanagawa" should be --Kawasaki--.

Col. 1, line 68, "unbalance" should be --imbalance--.

Signed and Sealed this

Twelfth Day of April 1983

[SEAL]

Attest:

GERALD J. MOSSINGHOFF

Attesting Officer     Commissioner of Patents and Trademarks